(12) United States Patent
Boettcher et al.

(10) Patent No.: US 11,573,280 B2
(45) Date of Patent: Feb. 7, 2023

(54) COIL ASSEMBLY FOR COMPENSATION CURRENT SENSOR (71) Applicant: Vacuumschmelze GmbH & Co. KG, Hanau (DE)

(72) Inventors: Steffen Boettcher, Hanau (DE); Daniel Jordan, Hanau (DE)

(73) Assignee: VACUUMSCHMELZE GMBH & CO. KG, Hanau (DE)

( * ) Notice: Subject to any disclaimer, the term of this patent is extended or adjusted under 35 U.S.C. 154(b) by 0 days.

(21) Appl. No.: 17/503,798

(22) Filed: Oct. 18, 2021

(65) Prior Publication Data
US 2022/0120832 A1 Apr. 21, 2022

(30) Foreign Application Priority Data

Oct. 20, 2020 (DE) .......................... 102020127623.0

(51) Int. Cl.
*G01R 33/3873* (2006.01)
*G01R 19/00* (2006.01)

(52) U.S. Cl.
CPC ..... *G01R 33/3873* (2013.01); *G01R 19/0092* (2013.01)

(58) Field of Classification Search
CPC .... G01R 15/18; G01R 15/183; G01R 15/185; G01R 15/207; G01R 19/0092;
(Continued)

(56) References Cited

U.S. PATENT DOCUMENTS 1,306,815 A * 6/1919 Houchin ................. H01F 38/30
310/182
6,275,129 B1 * 8/2001 van Oort ............ G01R 33/3873
324/320
(Continued)

FOREIGN PATENT DOCUMENTS

DE       10045194 A1     3/2002
DE       69833953 T2     12/2006
DE       10331883 B4      1/2018

OTHER PUBLICATIONS

German Request for Examination with English translation dated Aug. 11, 2021 for German Application No. 102020127623.0, 9 pages.

*Primary Examiner* — Steven L Yeninas
(74) *Attorney, Agent, or Firm* — Dickinson Wright PLLC (57) ABSTRACT

A device which can be used for current measurement is described hereinafter. According to one exemplary embodiment, the device comprises the following: a coil carrier extending along a longitudinal axis having a base body which in a central region has a section having reduced cross-sectional area, which is smaller than the cross-sectional area outside the central region, and a magnetic field probe having a ferromagnetic sensor strip, which is fastened to the coil carrier in the section having reduced cross-sectional area, and having a sensor coil which is wound around the coil carrier in the central region so that it encloses the sensor strip. The device also comprises a film which at least partially covers the section having reduced cross-sectional area. A secondary winding is wound around the coil carrier, wherein the secondary winding is wound around the film in the section having reduced cross-sectional area.

14 Claims, 5 Drawing Sheets

(58) Field of Classification Search
CPC . G01R 33/3873; H01F 27/325; H01F 29/146; H01F 2029/143
See application file for complete search history.

(56) References Cited

U.S. PATENT DOCUMENTS

| | | | |
|---|---|---|---|
| 6,417,661 | B1 | 7/2002 | Berkcan et al. |
| 2002/0097126 | A1* | 7/2002 | Fujiwara ................. H01F 3/10 336/110 |
| 2004/0204875 | A1* | 10/2004 | Kopken ............... G01R 15/185 702/64 |
| 2006/0158176 | A1 | 7/2006 | Preusse et al. |
| 2006/0226826 | A1* | 10/2006 | Teppan ................. G01R 33/04 324/117 H |
| 2014/0300350 | A1* | 10/2014 | Teppan ............... G01R 15/185 324/244 |
| 2019/0277888 | A1* | 9/2019 | Gutierrez Hernandez ................. H01F 27/325 |

* cited by examiner

COIL ASSEMBLY FOR COMPENSATION CURRENT SENSOR

This U.S. patent application claims priority to DE Patent Application No. 10 2020 127 623.0, filed Oct. 20, 2020, the entire contents of which is incorporated herein by reference in its entirety.

TECHNICAL AREA

The present description relates to the field of current sensors, in particular the so-called compensation current sensors.

BACKGROUND

Various types of current sensors are known and are commercially available. One type of current sensor are so-called compensation current sensors. These are constructed in such a way that the current to be measured (primary current) generates a magnetic flux in a soft magnetic core and the sensor electronics provide a compensation current (secondary current) that flows through a compensation coil which causes a flux in the opposite direction in the soft magnetic core. The superposition (sum) of the magnetic flux components caused by the primary current and the compensation current is regulated to zero (by means of a closed control loop). This is done by means of a magnetic field probe.

In some current sensors, magnetic field probes are used which comprise a strip made of magnetic material (sensor strip). For example, sensor strips made of Vitrovac® are suitable, which have a magnetization characteristic which is nonlinear but has very symmetrical hysteresis (cf., for example DE 10045194 A1, corresponding to US2004/0204875A1). Known current sensor devices have a coil carrier for the compensation coil and a carrier for the sensor strip. During the manufacturing, the coil carrier and sensor strip carrier are first prepared and then joined together, which is comparatively complex and often has to be carried out manually. First, the sensor strip is applied to an adhesive film, which is then installed on the carrier in a semi-automated manner. The carrier having the sensor strip is now wound with the probe coil, and the ends of the windings are selectively soldered. A shrink tube is applied thereon. The coil carrier is also wound and the coil ends are subsequently selectively soldered. Both components subsequently have to be joined together and the soft magnetic core is installed. The entire procedure is comparatively complex to produce and therefore costly and error-prone.

The inventors have made it the object to improve the mechanical structure of a current sensor having a compensation winding in order to enable simpler and more cost-effective manufacturing.

SUMMARY

A device which can be used for current measurement is described hereinafter. According to one exemplary embodiment, the device has the following: a coil carrier extending along a longitudinal axis having a base body which in a central region has a section having reduced cross-sectional area, which is smaller than the cross-sectional area outside the central region, and a magnetic field probe having a ferromagnetic sensor strip, which is fastened to the coil carrier in the section having reduced cross-sectional area, and having a sensor coil which is wound around the coil carrier in the central region so that it encloses the sensor strip. The device also has a film which at least partially covers the section having reduced cross-sectional area. A secondary winding is wound around the coil carrier, wherein the secondary winding is wound around the film in the section having reduced cross-sectional area.

A method for producing a current measuring device is furthermore described. According to one exemplary embodiment, the method comprises providing a coil carrier extending along a longitudinal axis having a base body which in a central region has a section having reduced cross-sectional area, which is smaller than the cross-sectional area outside the central region. The method furthermore comprises fastening a ferromagnetic sensor strip on the coil carrier in the section having reduced cross-sectional area and winding a sensor coil around the central region of the coil carrier so that it encloses the sensor strip. A film is fastened on the coil carrier in such a way that it at least partially covers the section having reduced cross-sectional area. The method furthermore comprises winding a secondary winding around the coil carrier, wherein the secondary winding is wound around the film in the section having reduced cross-sectional area.

BRIEF DESCRIPTION OF THE DRAWINGS

In the following, exemplary embodiments are explained in more detail with the aid of illustrations. The illustrations are not necessarily to scale and the exemplary embodiments are not limited to the aspects shown. Rather, emphasis is placed on illustrating the principles underlying the exemplary embodiments. In the figures.

DETAILED DESCRIPTION

The exemplary embodiments described here relate to a current sensor device having a compensation coil. The functional principle of such a current sensor is known per se and is not discussed in detail here, but only briefly summarized (cf., for example, DE 10045194 A1, corresponding to US2004/0204 875 A1). As usual, such a current sensor comprises a soft magnetic core having a primary winding (usually only one turn), which carries the current to be measured (primary current), a compensation winding (secondary winding), which carries a secondary current referred to as a compensation current, and a magnetic field probe. The latter comprises a ferromagnetic metal strip referred to as a sensor strip and a probe coil (also referred to as a sensor winding). The sensor strip is made, for example, from a cobalt-iron (CoFe) or a nickel-iron (NiFe) alloy (for example, Vitrovac®) or similar magnetic alloys.

An excitation current provided by an oscillator flows through the sensor winding, due to which the sensor strip is periodically magnetized with alternating polarity, usually until saturation is reached. The hysteresis characteristic is highly symmetrical (due to the material), and the magnetic flux in the soft magnetic core mentioned above creates an asymmetry which is evaluated (if there is no asymmetry, the magnetic flux is zero). The current sensor comprises control electronics which adjust the compensation current so that the magnetic flux in the soft magnetic core becomes zero. This zero point is detected by means of the magnetic field probe. In this state, the compensation current is proportional to the primary current, wherein the proportionality factor depends on the ratio of the number of turns of the primary winding and the compensation winding. The regulated compensation current can be measured very precisely, for example by means of a measuring resistor, and the resulting measured value also represents the primary current due to the above-mentioned proportionality. Strictly speaking, the primary winding is not part of the current sensor, but the primary conductor is magnetically coupled (with the aid of the soft magnetic core) to the compensation winding in operation.

The exemplary embodiments described here are intended to design a coil carrier for the compensation winding in such a way that it can also be used as a carrier for the sensor strip of the magnetic field probe at the same time. The coil carrier and the sensor strip carrier are therefore an integral component, which simplifies the manufacturing of the current sensor device as a whole. The current sensor device is therefore less expensive and less error-prone. An example of the coil carrier design described here is shown in FIG. 1.

Figure 1:
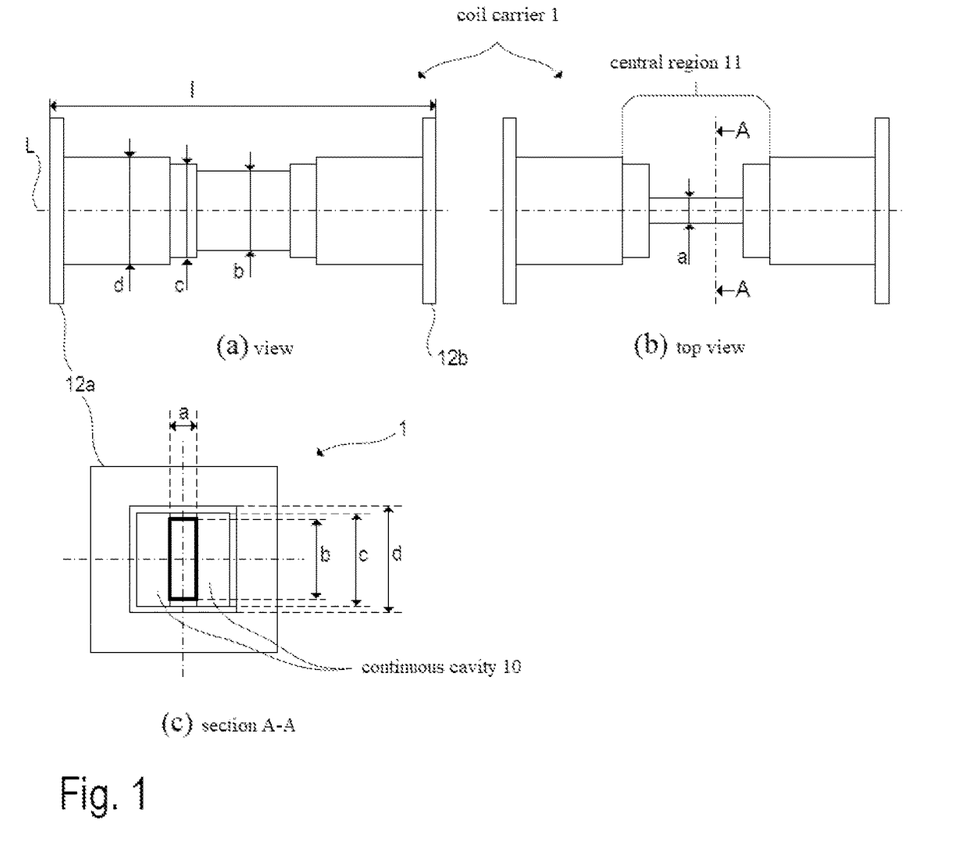
FIG. 1 contains a view and top view of a coil carrier having an integrated sensor strip carrier according to one exemplary embodiment, as well as an associated sectional view.

According to FIG. 1, the coil carrier 1 has a prismatic or cylindrical basic shape (for example having a rectangular or round footprint) which extends along a longitudinal axis L which also defines the longitudinal axis of the compensation coil. Diagram (a) of FIG. 1 shows a side view, diagram (b) shows the corresponding top view, and diagram (c) shows a cross-sectional view (section plane A-A). The coil carrier 1 is hollow in order to enable a soft magnetic core to be pushed through (cf. FIG. 7). That is to say, the cavity 10, in which the soft magnetic core will later find space, extends along the longitudinal axis L through the coil carrier 1.

The coil carrier 1 furthermore has a taper (i.e., a section having a reduced cross-sectional area) in a central region 11. In the illustration in FIG. 1, the above-mentioned taper is in a section of the coil carrier which is symmetrically (centrally) arranged with respect to the length l of the coil carrier 1 and in which the cross-sectional area of the coil carrier 1 deviates from the cross-sectional area of the above-mentioned basic shape. In the central region 11 of the coil carrier 1, the cross-sectional area is smaller than outside the central region 11 and, due to the taper, has, for example, a flat, for example rectangular cross-section (normal to the longitudinal axis L), wherein the length a of the cross-sectional area is significantly greater than the width b in the example shown in FIG. 1. The central region 11 does not necessarily lie symmetrically in the middle of the coil carrier 1 (with respect to its length l), but can also lie (asymmetrically) at any position between the two end faces of the coil carrier.

In the example from FIG. 1, the coil carrier 1 tapers in the central region 11 (from the outside toward the center) in two steps. Outside the central region 11, the coil carrier 11 has a square cross-sectional area having side length d (cross-sectional area d×d). At the edge of the central region 11, the cross-sectional area of the coil carrier is also square, but having a lesser side length c (i.e., c<d). Further towards the middle, the cross section of the coil carrier 1 tapers again; in the middle of the central region it has a rectangular cross-sectional area having the side lengths b (longer side) and a (shorter side). In the example shown, a<b<c<d applies. At each of the two ends (end faces), the coil carrier 1 has a circumferential collar 12a or 12b (web), which is intended to prevent the compensation winding from slipping down.

Figure 2:
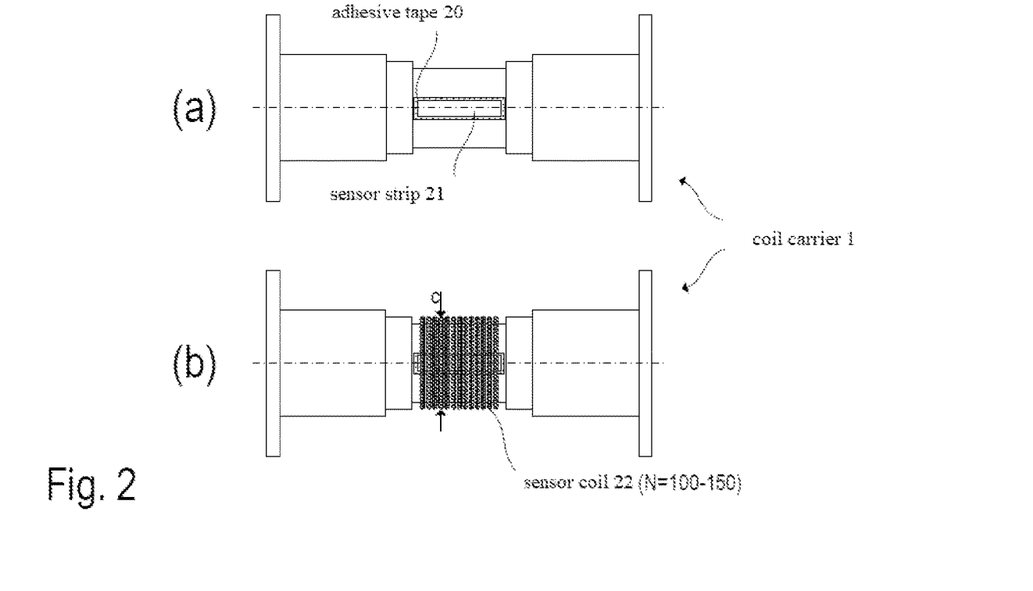
FIG. 2 illustrates the installation of the sensor strip on the coil carrier having integrated sensor strip carrier (diagram (a)) and the winding of the sensor strip with a probe coil (diagram (b)).

During the assembly of the current sensor device, the coil carrier 1 shown in FIG. 1 is first provided. This can, for example, be manufactured in one piece from plastic by means of injection molding. In the region in which the cross-sectional area of the coil carrier is smallest (in the example shown in the region having the width b), the sensor strip 21 is fastened on the outside of the coil carrier 1. In the present example, the sensor strip 21 is adhesively bonded to the coil carrier 1, namely by means of a short adhesive tape 20. This situation is shown in FIG. 2, diagram (a), which shows a side view of the coil carrier 1 having the sensor strip 21 adhesively bonded thereon. Other methods of fastening are possible, but adhesive tapes can be easily handled using conventional winding machines, which are also used to wind the sensor coil and compensation coil.

During the assembly of the current sensor device, in a next step a sensor coil 22 is wound around the coil carrier 1, specifically in such a way that the sensor coil 22 surrounds the sensor strip 21. This situation is shown in FIG. 2, diagram (b). In the example shown, the larger outer dimension of the sensor coil 22 is approximately equal to the side length c (cf. FIG. 1). The winding ends of the sensor coil 22 can be guided directly to a pin by a suitable guide and then welded directly thereto (see also FIG. 7). The welding process can, for example, be carried out by the winding machine.

Figure 3:
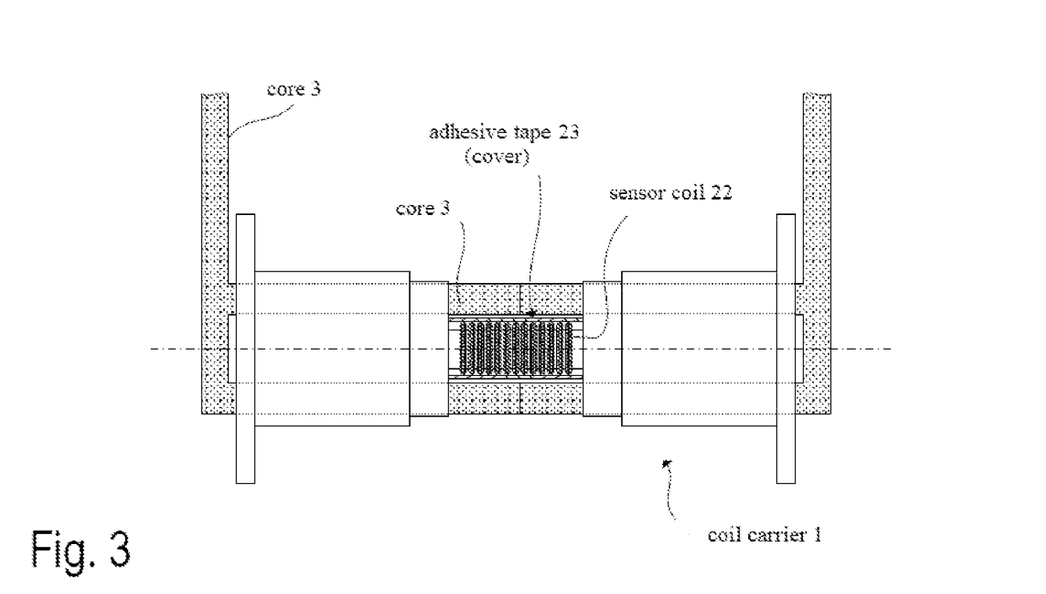
FIG. 3 illustrates the structure from FIG. 2 having an inserted soft magnetic core.

The soft magnetic core 3 can be introduced into the coil carrier 1 through the cavity 10 (cf. FIG. 1) and fed through the coil carrier 1 along the sensor strip 21 (for example, parallel thereto). In order that the magnetic field probe, in particular the sensor coil 22, is protected and cannot be damaged, according to one exemplary embodiment, the magnetic field probe is also enclosed using a shrink tube or another suitable cover 23. Alternatively, a further adhesive tape can also be used as a cover 23. This situation is shown in FIG. 3, which shows a top view of the coil carrier 1 having the soft magnetic core 3 installed. The use of a second adhesive tape as a cover 23 has the advantage that this can be applied automatically by the winding machine.

Figure 4:
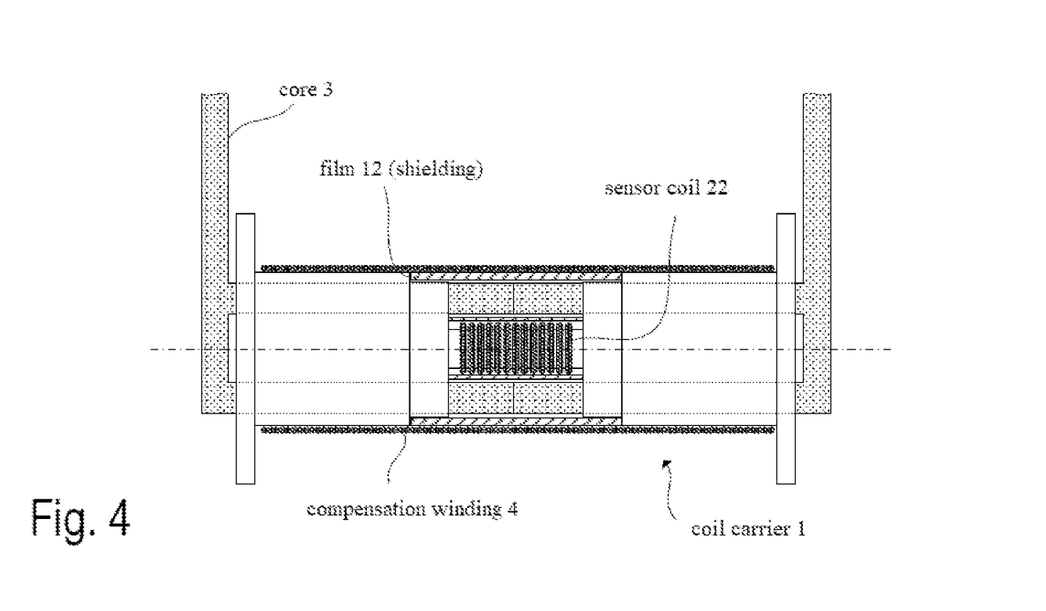
FIG. 4 illustrates the assembly from FIG. 4 having the compensation coil wound around the coil carrier.

The soft magnetic core 3 is shown in FIG. 3 only for the sake of completeness. It is obvious that while the coil carrier 1 is being wound by the winding machine, the core has not yet been inserted into the coil carrier 1. It therefore has to be ensured that the region in which the magnetic core 3 will later be located remains free. Before winding the coil carrier 11 with the compensation coil 4, the central region 11 is covered with a film 12 of suitable thickness. The film 12 ensures a uniform cross section of the compensation winding 4 along the longitudinal axis L and prevents the turns of the compensation winding 4 from penetrating into the space (part of the cavity 10, cf. FIG. 1) into which the magnetic core 3 is to be inserted later during the winding of the coil carrier 4. This situation (with the core 3 already inserted) is shown in FIG. 4. The thickness of the film 12 approximately corresponds to the difference in the distances d/2−c/2 (cf. FIG. 1), so that the cross section of the compensation coil 4 along the longitudinal axis L remains essentially the same and does not change. The film 12 rests against that part of the central region 11 of the coil carrier 1, the cross section (side length c) of which is slightly smaller than outside the central region (side length d). The installation of the film 12 can also be carried out in an automated manner using a winding machine. The film 12 can consist of plastic.

In a further exemplary embodiment, the film 12 consists of a metal in order to shield the magnetic field probe. In this case, the film 12 is used as a shield, for example against external magnetic fields, which could interfere with the measurement. For example, the film 12 can be made from a ferromagnetic alloy having a high relative permeability, for example from a soft-magnetic nickel-iron alloy such as Mu-metal, Permenorm®, Vitrovac®, or Vitroperm®. In a further exemplary embodiment, the film can consist of a laminate having one or more of the ferromagnetic alloys mentioned above (for example Vitrolam®). In this case, the (shielding) film is made of very solid, for example crystalline, thinly rolled material. The magnetic field probe protected in this way (sensor strip and sensor coil) has a comparatively high sensitivity and can therefore be influenced by external fields. The shielding film 12 therefore makes it possible to shield external fields directly at the sensor strip 21. The film 12 can also consist of multiple different materials.

For example, in the case of differential current sensors (having two primary conductors, wherein the respective primary currents generate at least partially destructively superimposing magnetic fields), this additional shielding by the film 12 can mean that a significantly more complex, full shielding of the entire current sensor device can be dispensed with, since the shielding takes place directly at the magnetic field probe. The offset caused by the earth's magnetic field, which acts directly on the magnetic field probe, can also be reduced in this way. Furthermore, external magnetic fields in the region of the probe are homogenized so that no saturation effects can occur and thus a direct influence on the output signal, which represents the primary or differential current, is avoided.

Figure 5:
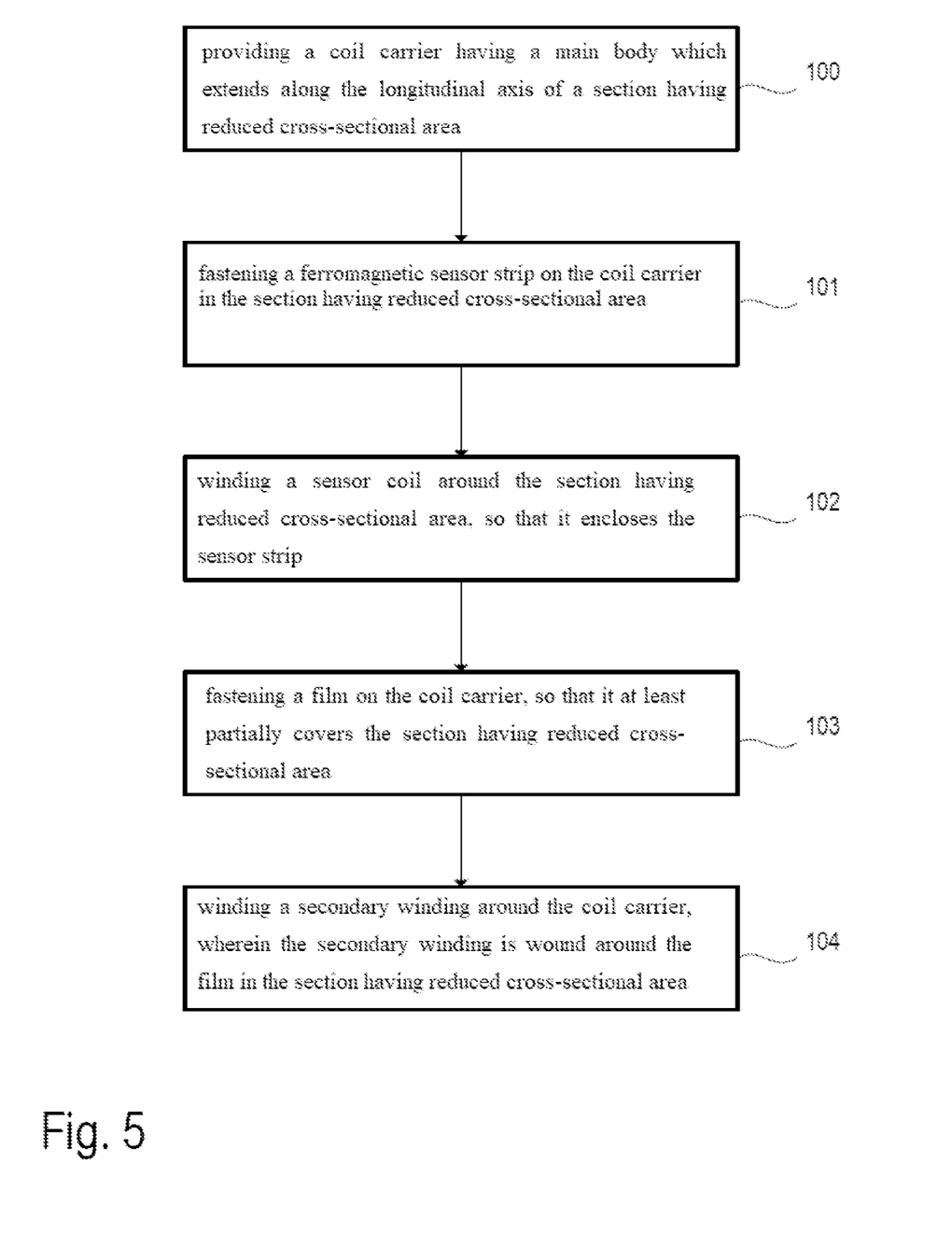
FIG. 5 is a flow chart to illustrate an example of a method for producing the current sensor devices described here.

An example of a method for producing a current sensor device is summarized hereinafter on the basis of the flow chart from FIG. 5. Accordingly, the method comprises the provision of a coil carrier extending along a longitudinal axis L having a base body which, for example, in a central region has a section having reduced cross-sectional area (a×b in the case of a rectangular cross section, cf. FIG. 1), which is smaller than the cross-sectional area (d×d) outside the central region (see FIG. 5, step 100). As mentioned, "central region" does not necessarily mean that this region is in the middle of the coil carrier. The method furthermore comprises attaching a ferromagnetic sensor strip to the coil carrier in the section having reduced cross-sectional area (see FIG. 5, step 101) and winding a sensor coil around the central region of the coil carrier (i.e., the section having reduced cross-sectional area) so that the sensor coil encloses the sensor strips (see FIG. 5, step 102). The sensor strip and the sensor coil form the magnetic field probe mentioned above. The method furthermore comprises fastening a cover, for example in the form of a film, on the coil carrier, so that it at least partially covers the section having reduced cross-sectional area (see FIG. 5, step 103) and winding a secondary winding around the coil carrier, wherein the secondary winding is wound around the cover (for example the film 12, see FIG. 4) in the section having reduced cross-sectional area (see FIG. 5, step 104). The cover (cf. FIG. 4, film 12) can be used, for example, as a shield against external, interfering magnetic fields.

Figures 6, 7:
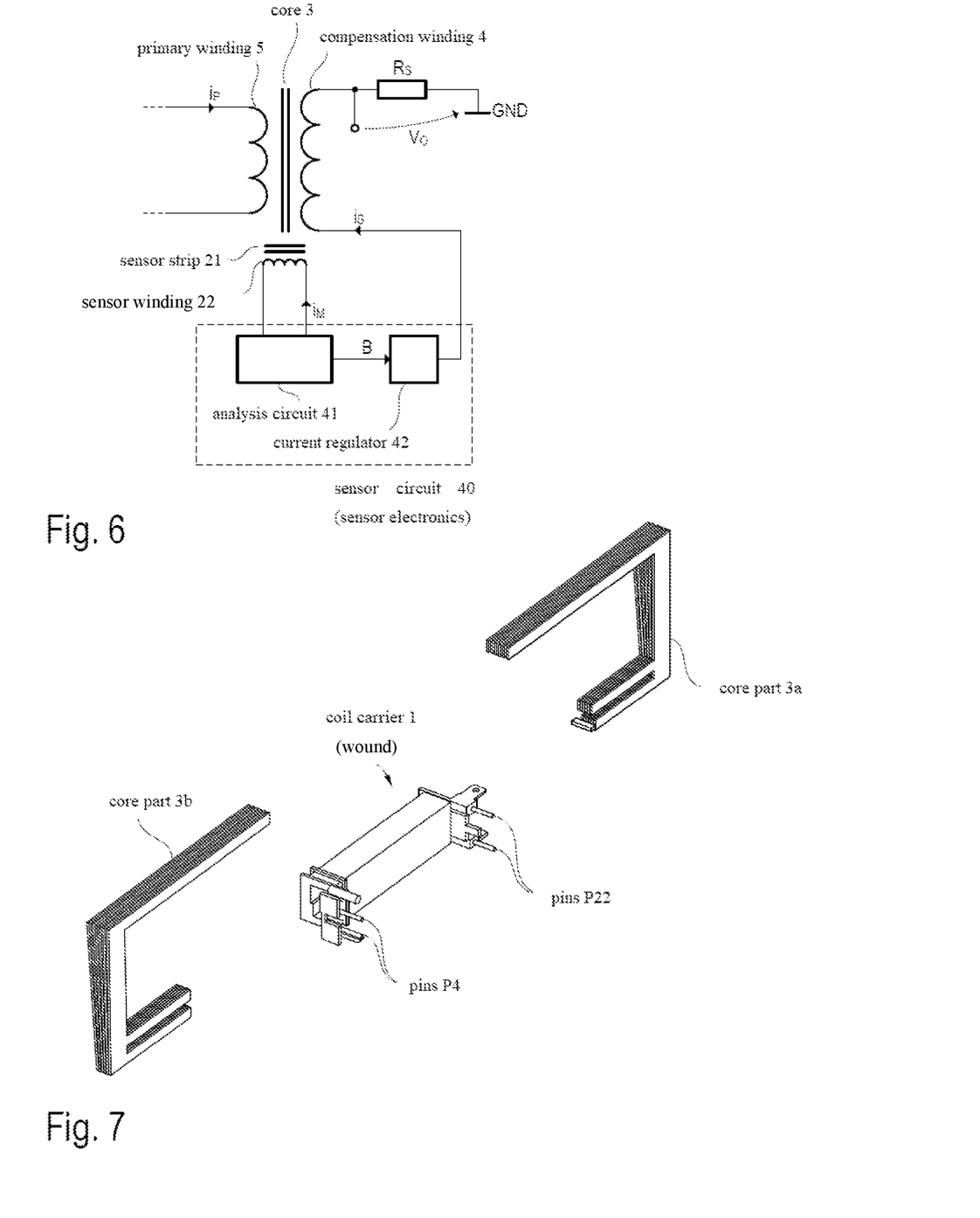
FIG. 6 is a block diagram to illustrate the use of the exemplary embodiments described here as a current sensor.
FIG. 7 is an exploded view of the coil carrier (including windings) and the soft magnetic core.

According to one exemplary embodiment, a soft magnetic core is then introduced into a cavity which extends along the longitudinal axis through the coil carrier (see also FIG. 7). The use of the current sensor device produced in this way as a current sensor is summarized below with reference to the block diagram in FIG. 6.

According to FIG. 6, the current sensor comprises a soft magnetic core 3 which is magnetically coupled to a primary winding 5 (usually only a single turn) and a secondary winding/compensation winding 4 (cf. also FIG. 4). The primary winding 5 carries the primary current $i_P$ to be measured and the compensation winding 4 carries the compensation current $i_S$ (secondary current). The magnetic flux components caused by the primary current $i_P$ and the secondary current $i_S$ are destructively superimposed in the core 3, wherein the resulting magnetic flux in the core 3 is regulated to zero. The magnetic flux is measured by means of a magnetic field probe which, as explained above, is formed from the sensor strip 21 and the sensor coil 22. The sensor coil 22 is connected to an evaluation circuit 41 which provides a measured value B representing the magnetic flux. Various suitable evaluation circuits are known per se and are therefore not explained further here. The evaluation circuit 41 usually comprises an oscillator which generates an excitation current $i_M$, which is fed into the sensor coil 22 and magnetizes it periodically with alternating polarity until it is saturated. Due to the symmetrical, ideally rectangular hysteresis characteristic of the sensor strip 21, any asymmetry that may be present in the alternating magnetization of the sensor coil 22 indicates a magnetic flux in the core 3 that is not equal to zero. This asymmetry can be evaluated. The evaluation circuit is coupled to the current regulator 42, which sets the secondary current $i_S$ in such a way that the mentioned asymmetry disappears or the measured value B (ideally) becomes zero.

In this state (measured value B is zero), the compensation current $i_S$ is proportional to the primary current $i_P$, wherein the proportionality factor depends on the ratio of the number of turns of the primary winding and the compensation winding. The regulated compensation current can be measured very precisely, for example by means of a measuring resistor $R_S$ and the resulting measured value (for example the output voltage $V_O=R_M\times i_S$) represents the primary current $i_P$ due to the above-mentioned proportionality.

FIG. 7 shows, as an exploded view, an exemplary embodiment of a wound coil carrier 1 and the soft magnetic core 3, which in the present example is made in two parts. During the assembly, the two core parts 3a and 3b can be inserted into the continuous cavity 10 (see FIG. 1) with one leg each at the opposite ends of the coil carrier 1. In the installed state, the two core parts touch each other so that a closed magnetic circuit without any significant air gap results. In operation, the primary conductor is fed through the soft magnetic core 3. The pins P4 of the compensation winding 4 and the pins P22 of the probe winding are also shown in FIG. 7.

Figure 8:
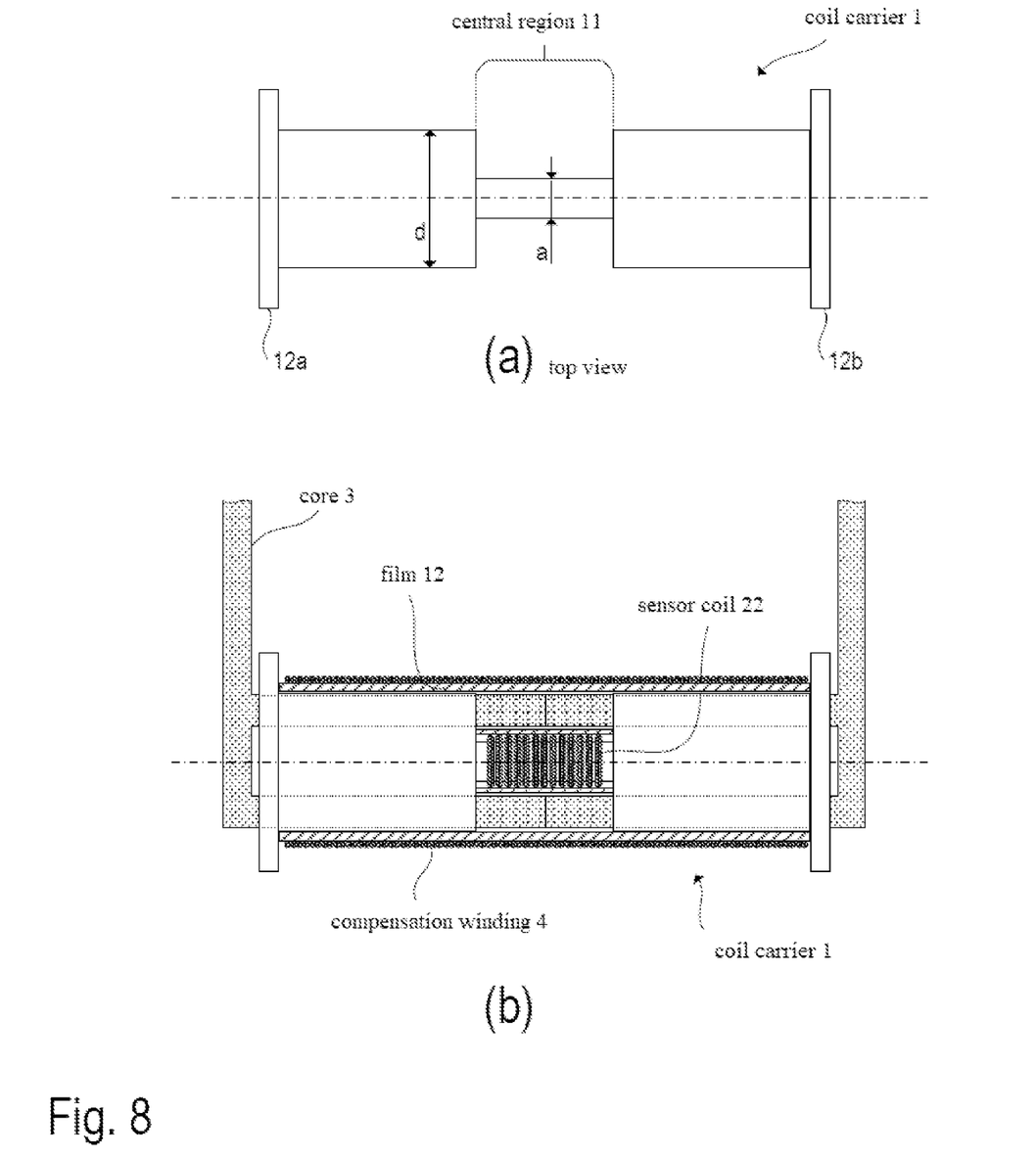
FIG. 8 illustrates a further exemplary embodiment which represents an alternative to the example from FIG. 4.

FIG. 8 shows an alternative embodiment of the coil carrier 1, in which the cross section is reduced from the outside toward the central region 11 in one step. In the example from FIG. 8, diagram (a), the cross-sectional area of the coil carrier outside the central region 11 is equal to d×d and inside the central region 11 is equal to a×b (wherein a<b<d). In contrast thereto, the cross section in the example from FIG. 1 (diagram (b)) tapers first from d×d to c×c and then from c×c to a×b. The film 12, which can also be used as a shield (but does not necessarily have to), covers the entire coil carrier 1 between the collars 12a, 12b in the example from FIG. 8. This situation is shown in FIG. 8, diagram (b). The secondary coil 4 is wound exclusively around the film 12 in this example.

The invention claimed is:

1. A device which comprises the following:
   a coil carrier extending along a longitudinal axis having a base body which in a central region has a section having reduced cross-sectional area, which is smaller than the cross-sectional area outside the central region,
   a magnetic field probe having a ferromagnetic sensor strip, which is fastened on the coil carrier in the section having reduced cross-sectional area, and having a sensor coil, which is wound around the coil carrier in the central region so that it encloses the sensor strip;
   a film which at least partially covers the section having reduced cross-sectional area; and
   a secondary winding, which is wound around the coil carrier, wherein in the section having reduced cross-sectional area, the secondary winding is wound around the film.

2. The device as claimed in claim 1, wherein the coil carrier has a cavity extending along the longitudinal axis through the coil carrier and wherein the cavity is at least partially enclosed by the film.

3. The device as claimed in claim 2, which furthermore comprises: a soft magnetic core which is fed through the cavity.

4. A current sensor assembly, which comprises the following:
   a device as claimed in claim 3;
   a primary conductor which is coupled to the soft magnetic core in such a way that a current flowing in the primary conductor causes a magnetic flux in the soft magnetic core;
   a sensor circuit coupled to the secondary winding which is designed to regulate a secondary current flowing through the secondary winding in such a way that the magnetic flux resulting from the secondary current through the soft magnetic core compensates for the magnetic flux caused by the primary current and the net flux is approximately zero.

5. The device as claimed in claim 1, wherein the sensor strip is fastened on the coil carrier by means of an adhesive tape.

6. The device as claimed in claim 1, wherein the sensor strip consists of a NiFe or CoFe alloy.

7. The device as claimed in claim 1, wherein the sensor strip has a magnetization characteristic having an essentially point-symmetrical hysteresis curve and/or wherein the sensor strip has a magnetization characteristic having an essentially rectangular hysteresis curve.

8. The device as claimed in claim 1, wherein the film consists of a plastic and/or the film is designed as an adhesive tape.

9. The device as claimed in claim 1, wherein the film consists of or comprises a ferromagnetic material.

10. The device as claimed in claim 9, wherein the film is used as a shield against external magnetic fields.

11. The device as claimed in claim 10, wherein the coil carrier is an integral component which consists of plastic.

12. The device as claimed in claim 1, wherein the secondary coil has an essentially constant cross-sectional area along the longitudinal axis.

13. A method for producing a current sensor, which comprises the following:
   providing a coil carrier extending along a longitudinal axis having a base body which in a central region has a section having reduced cross-sectional area, which is smaller than the cross-sectional area outside the central region,
   fastening a ferromagnetic sensor strip on the coil carrier in the section having reduced cross-sectional area;
   winding a sensor coil around the central region of the coil carrier so that it encloses the sensor strip;
   fastening a film to the coil carrier so that it at least partially covers the section having reduced cross-sectional area; and
   winding a secondary winding around the coil carrier, wherein in the section having reduced cross-sectional area the secondary winding is wound around the film.

14. The method as claimed in claim 13, which furthermore comprises:
   introducing a soft magnetic core into a cavity which extends along the longitudinal axis through the coil carrier.

* * * * *